United States Patent [19]

Hensler et al.

[11] 3,775,278

[45] Nov. 27, 1973

[54] TECHNIQUE FOR THE FABRICATION OF THIN FILM RESISTORS

[75] Inventors: Donald Henry Hensler, Emmaus, Pa.; Alexander Robert Ross, Piscataway, N.J.; Charles Archibald Steidel, Allentown, Pa.; Murray Lawrence Trudel, Whitehall, Pa.; Theodore Wallace Zuber, Jr., Macungie, Pa.

[73] Assignee: Bell Telephone Laboratories Incorporated, Murray Hill, N.J.

[22] Filed: Mar. 22, 1972

[21] Appl. No.: 237,047

[52] U.S. Cl. .................................. 204/192, 117/201

[51] Int. Cl. ............................................ C23c 15/00

[58] Field of Search .................................... 204/192

[56] References Cited

UNITED STATES PATENTS

| | | | |
|---|---|---|---|
| 3,714,013 | 1/1973 | Rairden | 204/192 |
| 3,703,456 | 11/1972 | Cordes | 204/192 |
| 3,664,943 | 5/1972 | Kumagai et al. | 204/192 |
| 3,627,577 | 12/1971 | Steidel | 204/192 |
| 3,242,006 | 3/1966 | Gerstenberg | 204/192 |

*Primary Examiner*—John H. Mack
*Assistant Examiner*—Sidney S. Kanter
*Attorney*—W. L. Keefauver

[57] ABSTRACT

A technique for preparing tantalum aluminum and tantalum nitride thin film resistors evidencing minimum aging and satisfactory anodization characeritstics is described. The procedure involves measuring the thermoelectric power of deposited films subsequent to the deposition process and maintaining this parameter within a prescribed range in subsequent depositions by varying the nitrogen or aluminum content of the sputtered film.

2 Claims, 3 Drawing Figures

TECHNIQUE FOR THE FABRICATION OF THIN FILM RESISTORS

This invention relates to a technique for the fabrication of thin film resistors. More particularly, the present invention relates to a technique for the fabrication of stable metal film resistors doped with nitrogen or aluminum.

DESCRIPTION OF THE PRIOR ART

During the past decade, miniaturization of components and circuitry coupled with the increasing complexity of modern electronic systems have created an unprecedented demand for reliability in thin film components and the need for the total exploitation of the technology. This is particularly true in the case of tantalum nitride and tantalum aluminum alloys which have rapidly become the most versatile of the resistor films. In order to maximize the advantages of such versatility, it is desirable in the fabrication of tantalum nitride and tantalum aluminum resistors to obtain materials manifesting minimum aging and satisfactory anodization characteristics.

With respect to tantalum nitride, studies have revealed that the nitrogen doping level of reactively sputtered tantalum films should be maintained at a level or within a range corresponding with tetragonally distorted b.c.c. tantalum or tantalum nitride ($Ta_2N$) - Ta rich. Thus, it was recognized that suitable analytical tools would be required in order to readily determine nitrogen content nondestructively prior to any subsequent device fabrication steps.

At the time of applicants' entry into the field the analytical means available for characterizing the nitrogen doping level of nitrided films included X-ray diffraction analysis, Hall coefficient measurements, spectrophotometric techniques and resistivity and temperature coefficient of resistance measurements. Despite the fact that each of these analytical procedures was useful from a diagnostic standpoint, various shortcomings dictated that efforts be made to find suitable alternatives.

Similar considerations also existed with respect to tantalum aluminum alloys. It had been recognized by early workers in the field that optimum device characteristics could only be obtained by maintaining the aluminum content of the deposited film within a certain range and precise analytical techniques were not available to effect this end.

SUMMARY OF THE INVENTION

In accordance with the present invention, these prior art limitations have been effectively obviated by utilizing a nondestructive analytical tool which relies upon the thermoelectric power or Seebeck coefficient as a means for characterizing the thin film of interest. Briefly, the inventive technique involves measuring the thermoelectric power of a deposited film following the sputtering operation and maintaining it within a predetermined range in subsequent depositions by adjusting either the nitrogen partial pressure or the volume of aluminum being sputtered.

BRIEF DESCRIPTION OF THE DRAWING

The invention will be more readily understood by reference to the following detailed description taken in conjunction with the accompanying drawings wherein.

DETAILED DESCRIPTION OF THE INVENTION

Figure 1:
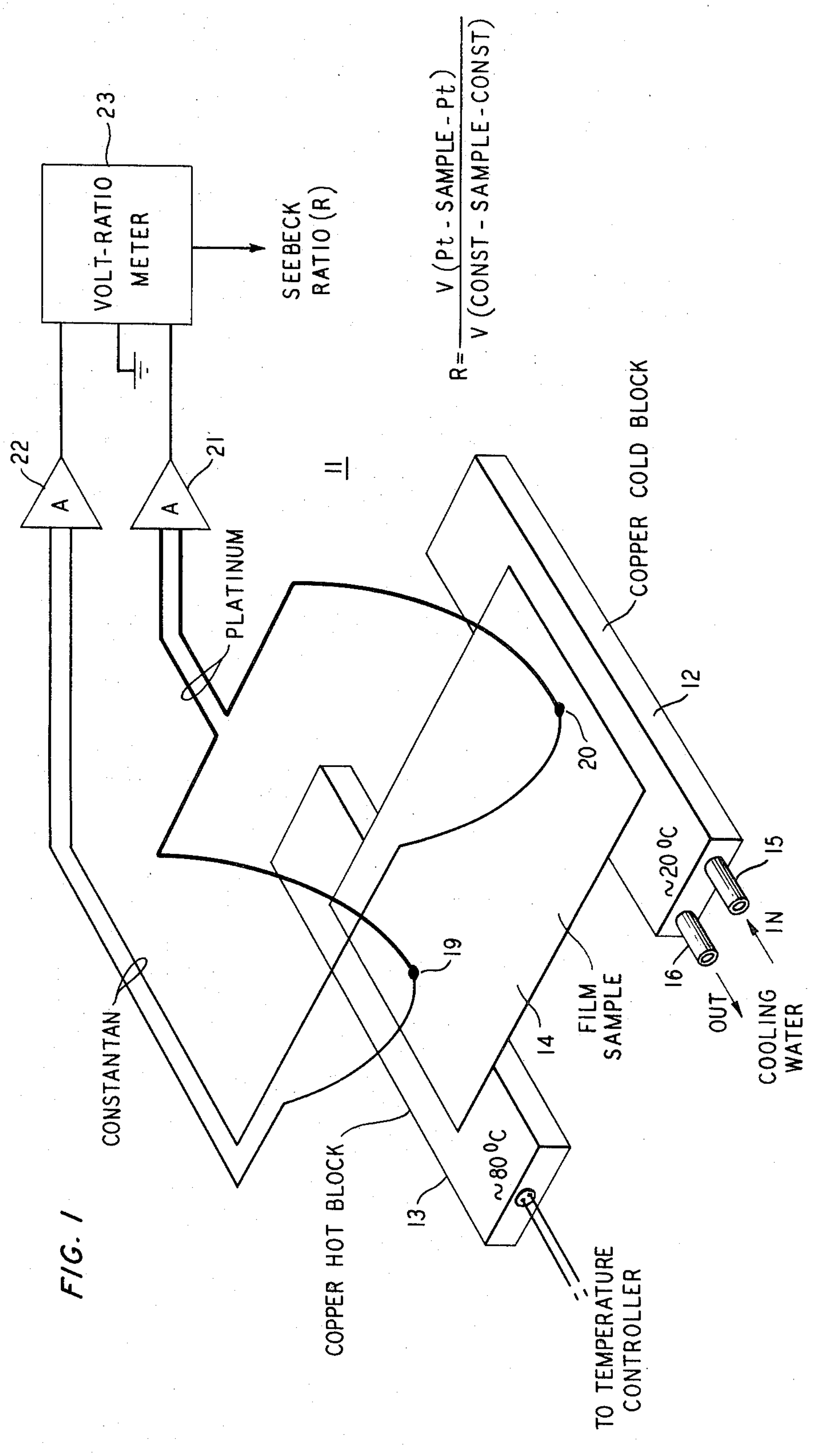
FIG. 1 is a schematic representation of an apparatus suitable for use in the practice of the present invention.

With reference now more particularly to FIG. 1, there is shown in schematic representation an apparatus suitable for use in the practice of the present invention. Shown in the figure is a Seebeck apparatus 11 comprising a pair of copper blocks 12 and 13 which serve as a support for a sample 14 comprising a substrate member having deposited thereon a thin film of tantalum aluminum or tantalum nitride. Block 12 is maintained at approximately 20°C and is provided with means 15 and 16 for the introduction and removal, respectively, of cool water to achieve this temperature and block 13 is heated to a temperature of about 80°C and is suitably disposed within an oven heated by any convenient means. The apparatus also includes a pair of spring loaded platinum-constantan probes 19 and 20 which, upon making contact with the sample, form two thermocouples, namely, the platinum-sample-platinum thermocouple and the constantan-sample-constantan thermocouple. In the operation of the described apparatus, a temperature gradient of approximately 60°C is established across the film sample between the two copper blocks which results in a mean temperature $T_M$ across the sample and voltage signals $V_{Pt}$ and $V_{Const}$ are generated in the platinum-sample-platinum thermocouple and in the constantan-sample-constantan thermocouple, respectively, such voltages being related to the Seebeck coefficient or the thermoelectric power of the materials. The Seebeck ratio of the film sample is obtained from the ratio of the signals $V_{Pt}$ and $V_{Const}$ and is given by $R = V_{Pt}/V_{Const}$. The equation relating the Seebeck coefficient of the materials to the Seebeck ratio R of the film sample is given by:

$$S_{Samp}\,(T_M) = [R\ S_{Const}\,(T_M) - S_{Pt}\,(T_M)\,]/(R-1)$$

where $T_M$ is the mean temperature across the film sample, $S_{Samp}\,(T_M)$ is the thermoelectric power of the sample at temperature $T_M$, $S_{Pt}\,(T_M)$ the thermoelectric power of platinum, $S_{Const}\,(T_M)$ the thermoelectric power of constantan and $R$ is the measured value of the Seebeck ratio of the film sample for a mean temperature $T_M$. Once R is known, $S_{Samp}\,(T_M)$ may in principle be determined from this last equation.

In the apparatus employed, the Seebeck ratio is obtained directly by amplifying the voltages $V_{Pt}$ and $V_{Const}$, electronically forming the ratio with a ratiometer and displaying the resultant quotient on a digital display. In FIG. 1 the amplifiers are designated 21 and 22 and the ratiometer is designated 23. The Seebeck ratio may then be used to characterize the films and serves as an effective means for determining either the nitrogen or aluminum content of the film subsequent to the sputtering operation. Accordingly, by measuring the Seebeck ratio or equivalently the thermoelectric power of the deposited films subsequent to the deposition process and maintaining it within a prescribed range, the operation is able to determine variations of nitrogen and aluminum content and, by varying either the partial pressure of the nitrogen or the amount of aluminum being sputtered, can vary the process so as to result in a film having the optimum resistor characteristics.

Studies have revealed that the most stable tantalum nitride films are obtained in films containing from 20 to 30 atomic percent nitrogen and nitrogen levels within that range are attainable when sputtering tantalum at voltages within the range of 4,500 to 8,000 volts in the presence of nitrogen. It will be appreciated that the partial pressure of the nitrogen during the operation of the inventive process may vary from $1.5 \times 10^{-5}$ to $1.5 \times 10^{-3}$ torr. dependent upon machine variables, such as current density to the cathode, cathode-anode spacing and the particular inert gas employed. Suitable inert gases include argon, neon, xenon and krypton. This compositional range has been found to correspond with a thermoelectric power ($T_M$ within the range of 15 – 30°C) within the range of +0.5 to −2.75 microvolts/°C and to a Seebeck ratio within the range 0.145 to 0.080. Accordingly, the present invention is conveniently conducted by sputtering tantalum in the presence of nitrogen and measuring the Seebeck ratio or thermoelectric power of a deposited film (as defined above) and maintaining it within the noted ranges in subsequent depositions by varying the partial pressure of nitrogen. Deviations therefrom adversely affect the stability of the deposited films and limit their suitability for device applications. Exceeding the negative value of thermopower often results in crystallization of the anodic oxide. Exceeding the positive limit of thermopower often results in electromigration effects.

Figure 2:
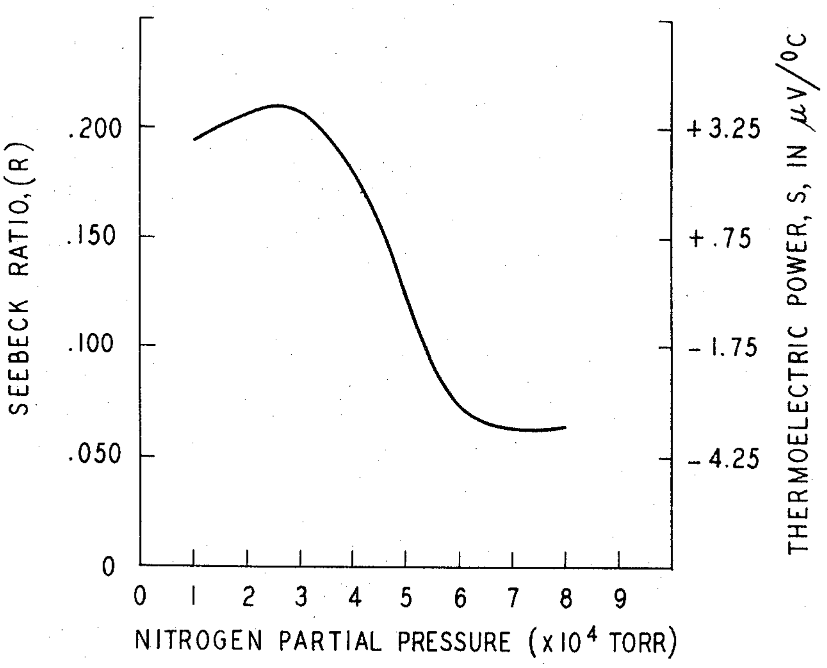
FIG. 2 is a graphical representation on coordinates of Seebeck ratio (R) and thermoelectric power (S) in microvolts/°C against nitrogen partial pressure in torr. showing variations in the Seebeck ratio and thermoelectric power as a function of nitrogen partial pressures for sputtered tantalum nitride films.

FIG. 2 is a graphical representation showing the relationship between the absolute thermoelectric power and Seebeck ratio (for the described apparatus) and the nitrogen partial pressure during a typical sputtering operation.

The data plotted in FIG. 2 was obtained by sputtering tantalum at 6,600 volts with a current density of 0.26 ma/cm² in the presence of nitrogen at the noted pressures and 10 microns of argon on both glass and ceramic substrate members. It has been determined that the optimum resistor materials from the standpoint of stability correspond with a Seebeck ratio of from 0.145 to 0.080 or equivalently a thermoelectric power ($T_M$ within the range of 15 – 30°C) from +0.5 to −2.75 microvolts/°C. Once again, it should be noted that this range has been found to correspond with a nitrogen content in the deposited film of from 20 to 30 atomic percent.

With respect to tantalum aluminum films, experimental data has revealed that the compositions of primary interest for resistor applications include from 45 to 60 atomic percent aluminum. These compositions are attainable with sputtering voltages of 4,500 to 8,000 volts. In order to study the variations in thermoelectric power over this compositional range, tantalum aluminum films were sputtered in an oil diffusion pumped system at 5,000 volts at a current density of 0.25 milliamperes/square centimeter with a 7.1 centimeter cathode-to-anode space. Aluminum content was varied by modifying the cathode employed, that is, utilizing a cathode having strips or buttons of aluminum affixed thereto in such fashion that the geometrical area covered coincided approximately with the desired aluminum content or by varying the d.c. bias to the d.c. tantalum rod in the well known rod sputtering process.

Figure 3:
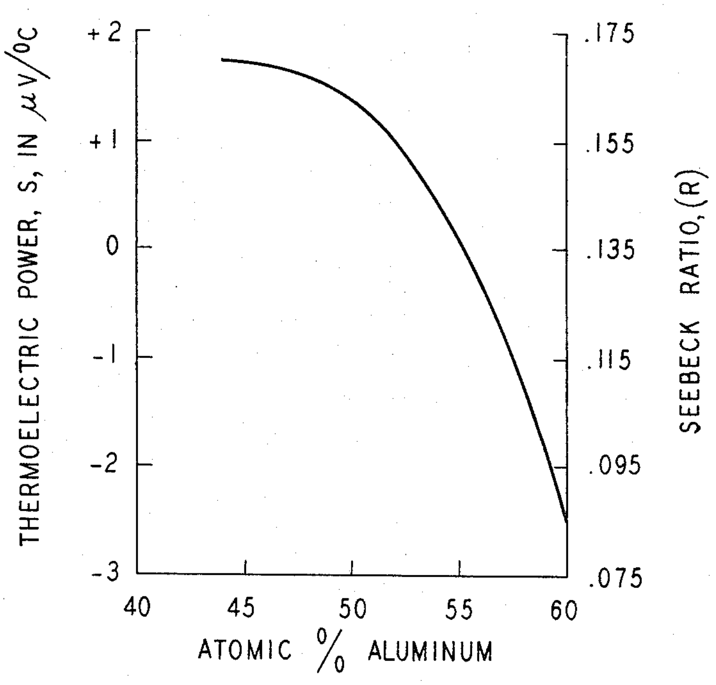
FIG. 3 is a graphical representation on coordinates of atomic per cent aluminum against Seebeck ratio (R) and thermoelectric power (S) (in microvolts/°C) showing variations in the Seebeck ratio and thermoelectric power as a function of aluminum content for sputtered tantalum aluminum films over a compositional range of from 45 to 60 atomic percent aluminum.

It will be noted that, by reference to FIG. 3, increasing aluminum content lowers the thermoelectric power ($T_M$ = 15 – 30°C) in the range of interest (45 to 60 atomic per cent aluminum) from about 1.7 microvolts/°C at the lower end of the range to about −2.4 microvolts/°C at the upper end, which corresponds with a Seebeck ratio of 0.169 at the lower end and 0.087 at the upper end. This sensitivity of thermoelectric power in this range, therefore, permits the rapid characterization of a tantalum aluminum sputtered film and provides the necessary information rapidly and nondestructively to modify the sputtering process.

Accordingly, it has been concluded that the variations in the Seebeck ratio and thermoelectric power for tantalum aluminum and tantalum nitride films indicate a similarity in the electronic properties of these materials over the optimum compositional range for both systems. These electronic transitions are characteristic of films with good oxidation resistance, high stability and the absence of electromigration effects.

In the operation of the described process, a tantalum aluminum or a tantalum nitride film is deposited by sputtering upon a substrate member in the manner described in U.S. Pat. No. 3,627,577, issued on Dec. 14, 1971 or in U.S. Pat. No. 3,242,006, issued on Mar. 22, 1966, respectively. During the sputtering process, the nitrogen partial pressure is maintained within the requisite range and the aluminum content is maintained within the desired range by controlling the geometrical area of the aluminum in the sputtering cathode or by varying the appropriate bias in a rod sputtering operation. The Seebeck ratio of a deposited film is then measured utilizing an apparatus of the type described in FIG. 1 in conjunction with conventional supporting apparatus and process variables modified in subsequent depositions in order to yield films evidencing optimum stability characteristics.

What is claimed is:

1. In a technique for the fabrication of a thin film resistor which comprises cosputtering tantalum and aluminum at a sputtering voltage within the range of 4,500 to 8,000 volts to yield a film having aluminum content within the range of 45 to 60 atomic percent, the steps of measuring the thermoelectric power of the deposited film which is maintained within the range of 1.7 to −2.4 microvolts/°C, measured at a mean temperature $T_M$ within the range of 15 – 30°C during the sputtering process and in response thereto varying the volume of aluminum being sputtered.

2. In a technique for the fabrication of a thin film resistor which comprises reactively sputtering tantalum at a sputtering voltage within the range of 4,500 to 8,000 volts in the presence of an inert gas and nitrogen to yield a film having a nitrogen content within the range of 20 to 30 atomic percent the steps of measuring the thermoelectric power of said film which is maintained within the range of +0.5 to −2.75 microvolts/°C, measured at a mean temperature $T_M$ within the range of 15 – 30°C during the sputtering process and in response thereto varying the partial pressure of the nitrogen.

* * * * *